United States Patent
Zhao

(10) Patent No.: US 12,254,944 B2
(45) Date of Patent: Mar. 18, 2025

(54) TEST SYSTEM AND TEST METHOD FOR DYNAMIC RANDOM ACCESS MEMORY MODULE OF INTEL SYSTEM

(71) Applicants: SQ TECHNOLOGY (SHANGHAI) CORPORATION, Shanghai (CN); INVENTEC CORPORATION, Taipei (TW)

(72) Inventor: Wei-Guo Zhao, Shanghai (CN)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 18/211,496

(22) Filed: Jun. 19, 2023

(65) Prior Publication Data
US 2024/0386986 A1    Nov. 21, 2024

(30) Foreign Application Priority Data
May 17, 2023   (CN) .......................... 202310556163.7

(51) Int. Cl.
G11C 29/00    (2006.01)
G11C 29/04    (2006.01)
G11C 29/56    (2006.01)

(52) U.S. Cl.
CPC .............. *G11C 29/56* (2013.01); *G11C 29/04* (2013.01)

(58) Field of Classification Search
CPC .............................. G11C 29/56; G11C 29/04
See application file for complete search history.

(56) References Cited

U.S. PATENT DOCUMENTS

| | | | | |
|---|---|---|---|---|
| 4,229,796 A | * | 10/1980 | Garrett | G01N 29/265 73/622 |
| 6,453,398 B1 | * | 9/2002 | McKenzie | G11C 29/12 711/202 |
| 6,738,882 B1 | * | 5/2004 | Gau | G11C 29/56 714/763 |
| 7,139,954 B1 | * | 11/2006 | Korhonen | G06F 11/263 714/736 |
| 2014/0192583 A1 | * | 7/2014 | Rajan | G11C 7/10 365/63 |
| 2019/0052539 A1 | * | 2/2019 | Pappu | H04L 43/50 |

* cited by examiner

*Primary Examiner* — Esaw T Abraham

(57) ABSTRACT

Disclosed are a test system and a test method for a DRAM module of an INTEL system. The test system includes at least one memory module slot and a processing unit. When performing a test, a memory temperature sensing of a BIOS is turned off through an operating system. Then, an operation register in the INTEL central processing unit that has a function of connecting the DRAM module is detected, and a memory module transfer register determines whether the DRAM module is correctly plugged in. Then, the operation register accesses the EEPROM of the DRAM module, and writes test data to and reads the test data from the EEPROM by switching different storage pages of the EEPROM to complete the test.

8 Claims, 2 Drawing Sheets

TEST SYSTEM AND TEST METHOD FOR DYNAMIC RANDOM ACCESS MEMORY MODULE OF INTEL SYSTEM

CROSS-REFERENCE TO RELATED DISCLOSURES

This application claims priority to Chinese patent application No. 202310556163.7 filed with the Chinese Patent Office on May 17, 2023, entitled "TEST SYSTEM AND TEST METHOD FOR DYNAMIC RANDOM ACCESS MEMORY MODULE", the entire contents of which are incorporated by reference.

TECHNICAL FIELD

The present disclosure relates to the technical field of a test system and method for a dynamic random access memory module of an INTEL system, and in particular, to a test system and method configured for testing read and write functions of a serial presence detection information of an electronically-erasable programmable read-only memory of a dynamic random access memory in the INTEL system.

BACKGROUND

Generally, manufacturers, such as server assembly manufacturers or notebook computer assembly manufacturers, typically only perform stress tests for reading and writing of memory, i.e., testing the stability of the memory, and testing the ability of the memory to store and retrieve data. However, the Serial Presence Detection information programmed in the Electrically-Erasable Programmable Read-Only Memory (EEPROM) in the memory is not tested. However, the Serial Presence Detection (SPD) information usually records some important information about the memory module, such as the type of memory particle, serial number, capacity, speed, required voltage, and manufacturer, etc. In practice, it should be confirmed that the SPD information can be written correctly. In operation, it is necessary to obtain the relevant information in the SPD information, so that the access timing of the memory module can be set in an optimal state when using the memory, which can ensure a normal and stable operation of the system.

SUMMARY

The present disclosure provides a test system and a test method for a Dynamic Random Access Memory (DRAM) module of an INTEL system. The DRAM module is accessed through a System Management (SM) bus by an operation register, so as to write test data to and read the test data from the EEPROM of the DRAM module to confirm the write and read functions of the SPD information.

The present disclosure provides a test system for a DRAM module of an INTEL system, configured to verify the information write and read functions of an EEPROM included in the DRAM module. The test system includes at least one memory module slot and a processing unit.

The at least one memory module slot is configured for insertion of the DRAM module, and the DRAM includes the EEPROM.

The processing unit includes at least one operation register. The at least one operation register is electrically coupled to the at least one memory module slot through at least one system management bus.

The at least one operation register of the processing unit accesses the DRAM module through the at least one system management bus, and can write test data to and read the test data from the EEPROM.

Furthermore, the INTEL system includes a Basic Input/Output System (BIOS). The BIOS is a firmware that can perform hardware initialization during the power-on startup phase and provide services for the operating system during runtime. In addition, the BIOS can sense a memory temperature. The BIOS needs to be turned off before the at least one operation register of the processing unit accesses the DRAM module, so as to avoid conflicts when the at least one operation register accesses the DRAM module.

In addition, the processing unit of the test system is an INTEL Central Processing Unit (CPU).

After turning off memory temperature sensing of the BIOS through an operating system, the test system controls the at least one operation register of the INTEL CPU to access the DRAM module.

Further, the test system further includes at least one memory controller, through which the SPD information and temperature sensing (Temperature Sensor on DIMMs, TSOD) information in the DRAM module can be read. The at least one memory controller accesses the DRAM module through the at least one system management bus by reading a slave address of the at least one system management bus read and written by the DRAM module.

Continuously, the processing unit in the aforementioned test system further includes a memory module transfer register. The at least one memory module slot is a Dual In-line Memory Module (DIMM) slot. The memory module transfer register is electrically coupled to each memory module slot. The memory module transfer register can detect whether the DRAM module is installed in the at least one memory module slot.

The processing unit further includes a plurality of operation registers, and one operation register of the plurality of operation registers further includes a central processing unit bus register. The central processing unit bus register is electrically coupled to two system management buses, respectively, and access the memory module slots connected to the back ends of the two system management buses according bus identifiers corresponding to the system management buses.

The test data of the test system may be at least one of a sample data and a SPD information. When there is no original sample data in the test system, one way is to write the sample data into the EEPROM and then read it out. Another way is to first write the SPD information, also through the slave address of the system management bus, to the EEPROM of the DRAM module, and then read the previously written SPD information from the EEPROM of the DRAM module through the system management bus.

In addition, due to the limited write and read times of the EEPROM, in the test system, the test data is verified by a small amount of writing and reading.

Further, the present disclosure also provides a test method for a DRAM module of an INTEL system configured to verify the information write and read functions of an EEPROM included in a DRAM module, especially for the write and read function of a SPD information. The test method includes the following steps.

In a first step, a memory temperature sensing of a BIOS is turned off through an operating system (OS), so as to reduce the impact of the INTEL CPU on the EEPROM.

In a second step, following the first step, an operation register in the INTEL CPU with a function of connecting the DRAM module is detected. The operating register further includes a central processing unit bus register.

In a third step, following the second step, the central processing unit bus register scans a bus identifier of at least one system management bus, and connects the memory module slot according to the corresponding bus identifier.

In a fourth step, a memory module transfer register is read, and the memory module transfer register detects whether the DRAM module is installed in the memory module slot and determines the location to be accessed.

In a fifth step, following the third step and the fourth step, the EEPROM of the DRAM module is accessed, and different storage pages included in the EEPROM is switched through the system management bus.

In a sixth step, following the fifth step, test data is written to the EEPROM and then read from the EEPROM.

The specific embodiments used in the present disclosure will be further described by the following embodiments and drawings.

DETAILED DESCRIPTION OF THE EMBODIMENTS

The inventor has found that when working with the conventional INTEL system, the SPD information is not tested. Although the INTEL system may seem cost-effective to users initially, they will find disadvantages such as poor stability, rapidly declined efficiency, etc., after long-term use.

An object of the present disclosure is to provide a test system and a test method for a DRAM module of an INTEL system. The DRAM module is accessed through a system management bus by an operation register to write test data to and read the test data from the EEPROM of the DRAM module, so as to confirm the write and read functions of the SPD information.

Figure 1:
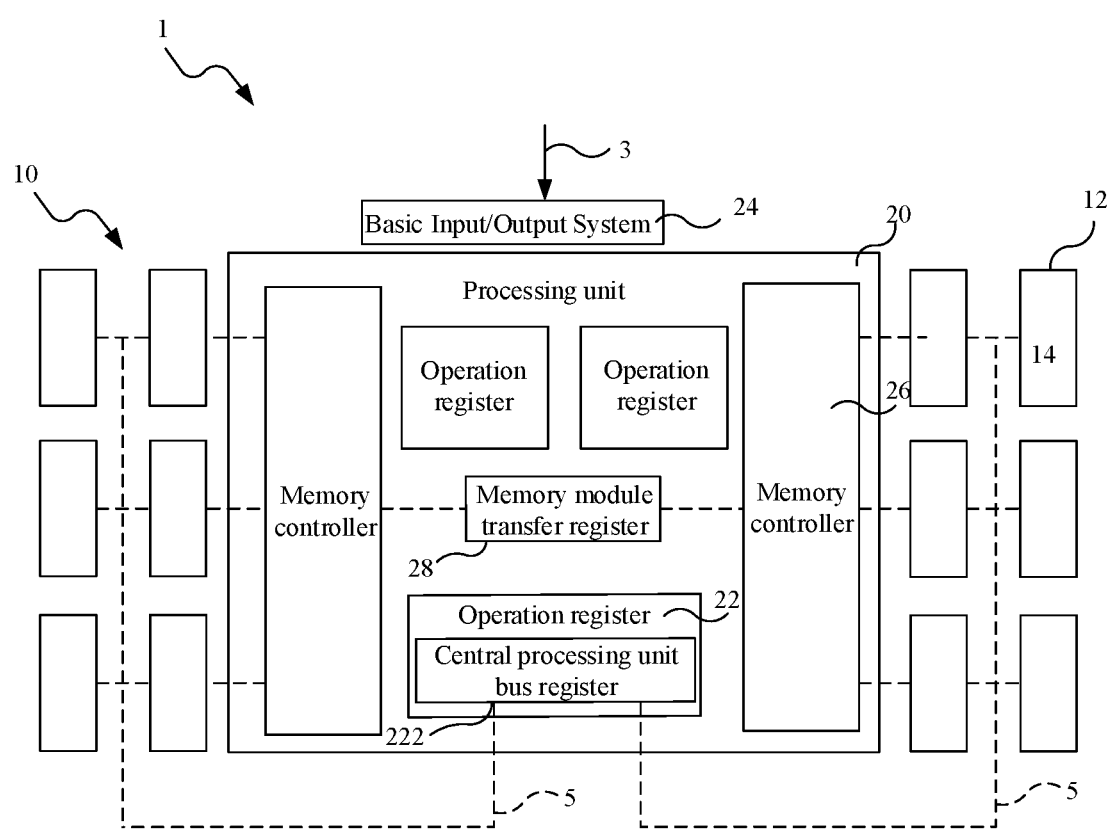
FIG. 1 is a functional correlation diagram of a test system for a DRAM module of an INTEL system according to some embodiments of the present disclosure.

Referring to FIG. 1, a functional correlation diagram of a test system 1 of the present disclosure is shown. As shown in FIG. 1, the present disclosure provides a test system 1 for a DRAM module 12 of an INTEL system. The test system 1 is configured to verify the information write and read functions of an EEPROM 14 included in the DRAM module 12. The test system 1 includes at least one memory module slot 10, a processing unit 20, a BIOS 24, and an operating system (OS) 3.

The at least one memory module slot 10 is configured for insertion of the DRAM module 12. The DRAM module 12 includes the EEPROM 14 into which the test data is to be written and from which the test data is to be read.

The processing unit 20 further includes at least one operation register 22. The at least one operation register 22 is electrically coupled to the at least one memory module slot 10 through at least one system management bus 5.

The at least one operation register 22 of the processing unit 20 accesses the DRAM module 12 through the at least one system management bus 5 and can write the test data to and read the test data from the EEPROM 14.

Furthermore, the INTEL system further includes the BIOS 24, which is a firmware that can perform hardware initialization during the power-on startup phase and provide services for the operating system 3 during runtime. In addition, the BIOS 24 can sense the temperature of the memory. Before the at least one operation register 22 of the processing unit 20 accesses the DRAM module 12, the BIOS 24 needs to be turned off to avoid conflicts when the at least one operation register 22 accesses the DRAM module 12.

In addition, the processing unit 20 of the test system 1 is an INTEL CPU, which is more expensive than an AMD central processing unit but has a more stable and durable performance in long-term use. Furthermore, most INTEL CPUs have a multi-core design and are the main products used by consumers.

After turning off the memory temperature sensing of the BIOS 24 through the operating system 3 (OS), the test system 1 can control one of the operation registers 22 of the INTEL CPU to access the DRAM module 12.

The processing unit 20 of the test system 1 further includes a memory module transfer register 28. The at least one memory module slot 10 is a dual in-line memory module slot. The memory module transfer register 28 is electrically coupled to each memory module slot 10, respectively. The memory module transfer register 28 can detect whether the DRAM module 12 is installed in the at least one memory module slot 10. The test system 1 can start to perform access to find the correct access address after confirming that the DRAM module 12 is installed in the at least one memory module slot 10.

The test system 1 further includes at least one memory controller 26. As shown in the figure, there are two memory controllers 26. The memory controllers 26 can read the SPD information and the temperature sensing information in the DRAM module 12. The memory controllers 26 access the DRAM module 12 through the at least one system management bus 5 by reading a slave address of the at least one system management bus read and written by the DRAM module 12 and arranging the access after finding the corresponding address.

The processing unit 20 further includes a plurality of operation registers 22. As shown in the figure, there are three operation registers 22. One of the three operation registers 22 further includes a central processing unit bus register 222. The central processing unit bus register 222 is electrically coupled to two system management buses 5 respectively, and accesses the memory module slots 10 connected to the back ends of the two system management buses 5 according to bus identifiers corresponding to the system management buses.

The test data of the test system 1 may be at least one of a sample data and a SPD information. When there is no original sample data in the test system 1, one way is to write the sample data into the EEPROM 14 and then read it out. Another way is to first write the SPD information, also through the slave address of the system management bus, to the EEPROM 14 of the DRAM module 12, and then read the previously written SPD information from the EEPROM 14 of the DRAM module 12 through the system management buses.

In addition, due to the limited write and read times of the EEPROM 14, in the test system 1, the test data is verified by a small amount of writing and reading. For example, the EEPROM includes four quadrants, and each quadrant includes 128 bytes. Only 3 bytes of sample data are written into each quadrant of 128 bytes in the EEPROM for the write and read functions test. In other words, the information read and write functions of the EEPROM are verified by writing the test data to and reading the test data from a portion of the multiple bytes of the EEPROM.

Figure 2:
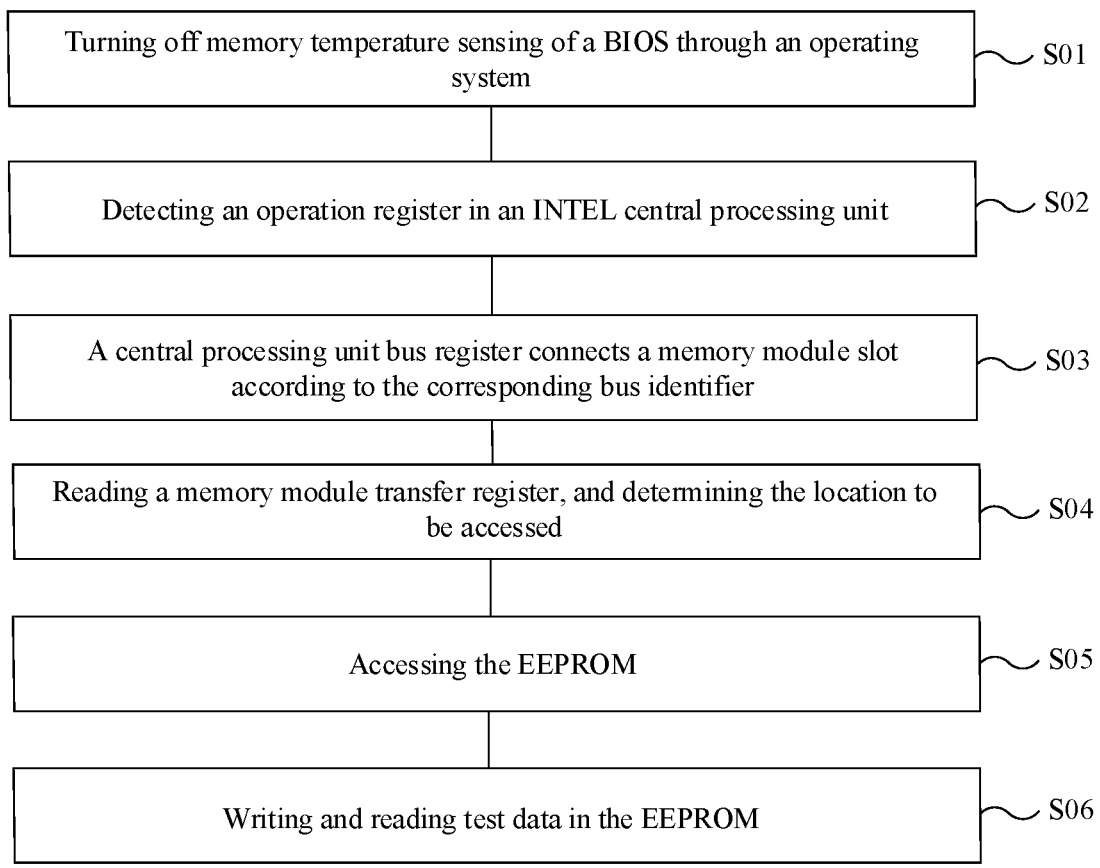
FIG. 2 is a schematic diagram of a method for a DRAM module of an INTEL system according to some embodiments of the present disclosure.

Further, referring to FIG. 2, a schematic diagram of a test method applied to the test system 1 of the present disclosure is shown. As shown in the figure, the present disclosure also provides a test method for a DRAM module 12 of an INTEL system configured to verify the information write and read functions of an EEPROM 14 included in the DRAM module 12, especially the write and read functions for the SPD information. The test method includes the following steps.

In a first step S01, a memory temperature sensing of a BIOS 24 is turned off through an operating system 3 (OS) to reduce the impact of an INTEL CPU on the EEPROM 14.

In a second step S02, following the first step, an operation register 22 in the INTEL CPU with the function of connecting the DRAM module 12 is detected. The operation register 22 further includes a central processing unit bus register 222.

In a third step S03, following the second step, the central processing unit bus register 222 scans a bus identifier of at least one system management bus 5, and connects the memory module slot 10 according to the corresponding bus identifier.

In a fourth step S04, a memory module transfer register 28 is read, and the memory module transfer register 28 detects that the DRAM module 12 is installed in the memory module slot 10 and determines the location to be accessed.

In a fifth step S05, following the third step and the fourth step, the EEPROM 14 of the DRAM module 12 is accessed, and different storage pages included in the EEPROM 14 are switched through the system management bus 5.

In a sixth step S06, following the fifth step, test data is written to the EEPROM 14 and then read from the EEPROM 14.

Therefore, in the test system 1 for the DRAM module 12 of the INTEL system and the method thereof provided by the present disclosure, the operation register 22 can access the DRAM module 12 through the system management bus 5, write the test data to and read the test data from the EEPROM 14, so as to avoid many disadvantages such as poor stability and rapidly declined efficiency of the INTEL system in long-term operation by users.

The above detailed description of the preferred embodiments is intended to describe the features and spirit of the present disclosure more clearly rather than limit the scope of the present disclosure with the preferred embodiments disclosed above. On the contrary, the intention is to cover various changes and equivalent arrangements within the scope of the claimed patent scope of the present disclosure.

What is claimed is:

1. A test system for a DRAM module of an INTEL system, configured to verify information write and read functions of an EEPROM comprised the DRAM module, wherein the test system comprises:

at least one memory module slot configured for insertion of the DRAM module;

a processing unit comprising a plurality of operation registers, one of the plurality of operation registers further comprising a central processing unit bus register, wherein the central processing unit bus register is electrically coupled to at least one system management bus and configured for accessing the at least one memory module slot connected to the at least one system management bus according to a bus identifier corresponding to the at least one system management bus;

wherein the operation register comprising the central processing unit bus register accesses the DRAM module through the at least one system management bus, and writes test data to and reads the test data from the EEPROM.

2. The test system according to claim 1, wherein the INTEL system comprises a BIOS configured to sense a memory temperature, wherein the BIOS is turned off before the at least one operation register of the processing unit accesses the DRAM module.

3. The test system according to claim 2, wherein the processing unit is an INTEL central processing unit.

4. The test system according to claim 3, wherein after turning off memory temperature sensing of the BIOS through an operating system, the test system controls the at least one operation registers of the INTEL central processing unit to access the DRAM module.

5. The test system according to claim 1, wherein the test system further comprises at least one memory controller, through which a serial presence detection information and a temperature sensing information in the DRAM module are read, wherein the at least one memory controller accesses the DRAM module through the at least one system management bus by reading a slave address of the at least one system management bus read and written by the DRAM module.

6. The test system according to claim 1, wherein the processing unit further comprises a memory module transfer register, the at least one memory module slot being a dual in-line memory module slot, the memory module transfer register being electrically coupled to each memory module slot, wherein the memory module transfer register detects whether the DRAM module is installed in the at least one memory module slot.

7. The test system according to claim 1, wherein the test data is at least one of a sample data and a serial presence detection information.

8. The test system according to claim 1, wherein the information read and write functions of the EEPROM are verified by writing the test data to and reading the test data from a portion of multiple bytes of the EEPROM.

* * * * *